(12) United States Patent
Kawasaki et al.

(10) Patent No.: US 7,808,064 B2
(45) Date of Patent: Oct. 5, 2010

(54) SEMICONDUCTOR PACKAGE INCLUDING THROUGH-HOLE ELECTRODE AND LIGHT-TRANSMITTING SUBSTRATE

(75) Inventors: Atsuko Kawasaki, Yokohama (JP); Mie Matsuo, Kamakura (JP); Ikuko Inoue, Yokohama (JP); Masayuki Ayabe, Yokohama (JP); Masahiro Sekiguchi, Yokohama (JP); Kazumasa Tanida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/508,293

(22) Filed: Jul. 23, 2009

(65) Prior Publication Data

US 2009/0283847 A1    Nov. 19, 2009

Related U.S. Application Data

(63) Continuation of application No. PCT/JP2008/073882, filed on Dec. 19, 2008.

(30) Foreign Application Priority Data

Dec. 27, 2007    (JP)    ............... 2007-338199

(51) Int. Cl.
H01L 31/02    (2006.01)
(52) U.S. Cl. ............... 257/432; 257/433; 257/448
(58) Field of Classification Search ......... 257/431–462
See application file for complete search history.

(56) References Cited

U.S. PATENT DOCUMENTS

| 6,489,675 | B1 | 12/2002 | Gruber et al. |
| 7,045,870 | B2 * | 5/2006 | Wataya ............... 257/433 |
| 7,274,101 | B2 * | 9/2007 | Tomita et al. ........... 257/730 |
| 7,276,738 | B2 * | 10/2007 | Wada ............... 257/98 |

| 2006/0071152 | A1 | 4/2006 | Ono |
| 2007/0181792 | A1 | 8/2007 | Yoshimoto et al. |
| 2008/0042227 | A1 | 2/2008 | Asano et al. |
| 2008/0128848 | A1 | 6/2008 | Suzuki et al. |

FOREIGN PATENT DOCUMENTS

JP    10-223833    8/1998

(Continued)

OTHER PUBLICATIONS

U.S. Appl. No. 12/629,322, filed Dec. 2, 2009, Saito, et al.

(Continued)

*Primary Examiner*—Leonardo Andújar

(57) ABSTRACT

An imaging element is formed on the first main surface of a semiconductor substrate. An external terminal is formed on the second main surface of the semiconductor substrate. A through-hole electrode is formed in a through hole formed in the semiconductor substrate. A first electrode pad is formed on the through-hole electrode in the first main surface. An interlayer insulating film is formed on the first electrode pad and on the first main surface. A second electrode pad is formed on the interlayer insulating film. A passivation film is formed on the second electrode pad and the interlayer insulating film, and has an opening which exposes a portion of the second electrode pad. A contact plug is formed between the first and second electrode pads in a region which does not overlap the opening when viewed in a direction perpendicular to the surface of the semiconductor substrate.

18 Claims, 14 Drawing Sheets

FOREIGN PATENT DOCUMENTS

| | | |
|---|---|---|
| JP | 2006-108285 | 4/2006 |
| JP | 2007-53149 | 3/2007 |
| JP | 2007-134725 | 5/2007 |
| JP | 2007-214360 | 8/2007 |
| JP | 2007-273629 | 10/2007 |
| JP | 2008-140819 | 6/2008 |

OTHER PUBLICATIONS

International Electron Devices Meeting 1999 Technical Digest pp. 879-882. H. Kurino et al., "Intelligent Image Sensor Chip with Three Dimensional Structure".

"Nikkei Micro Devices", Apr. 1998, pp. 28, 164, and 176.

* cited by examiner

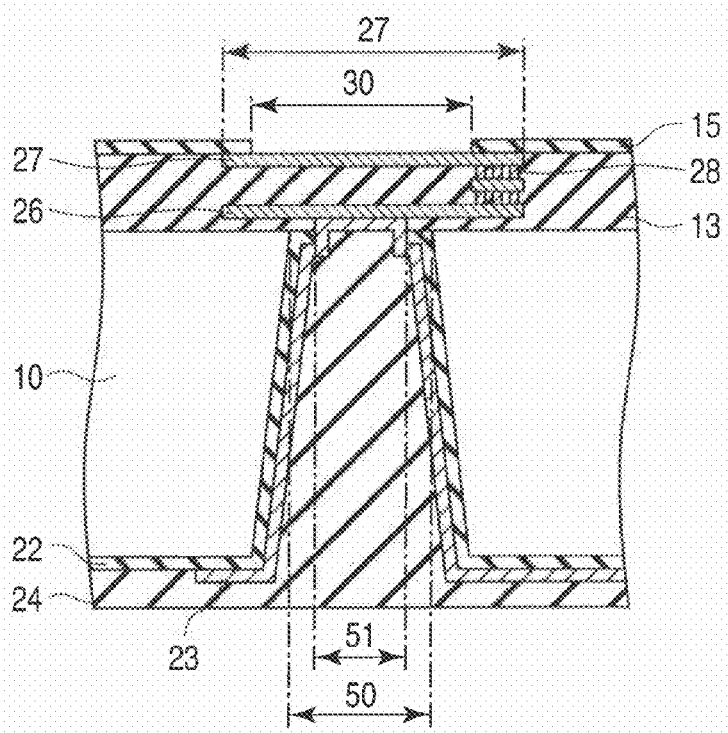
F I G. 11
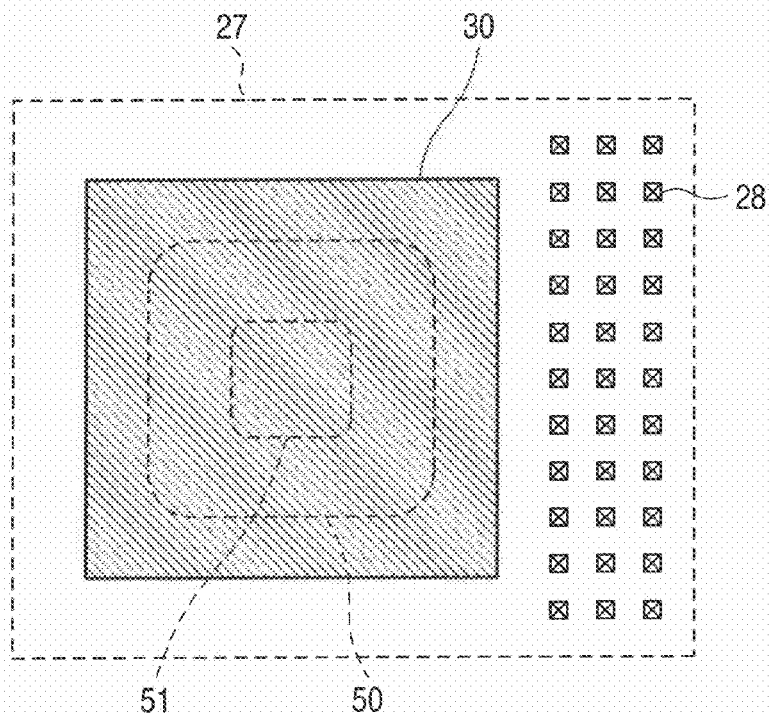
F I G. 12

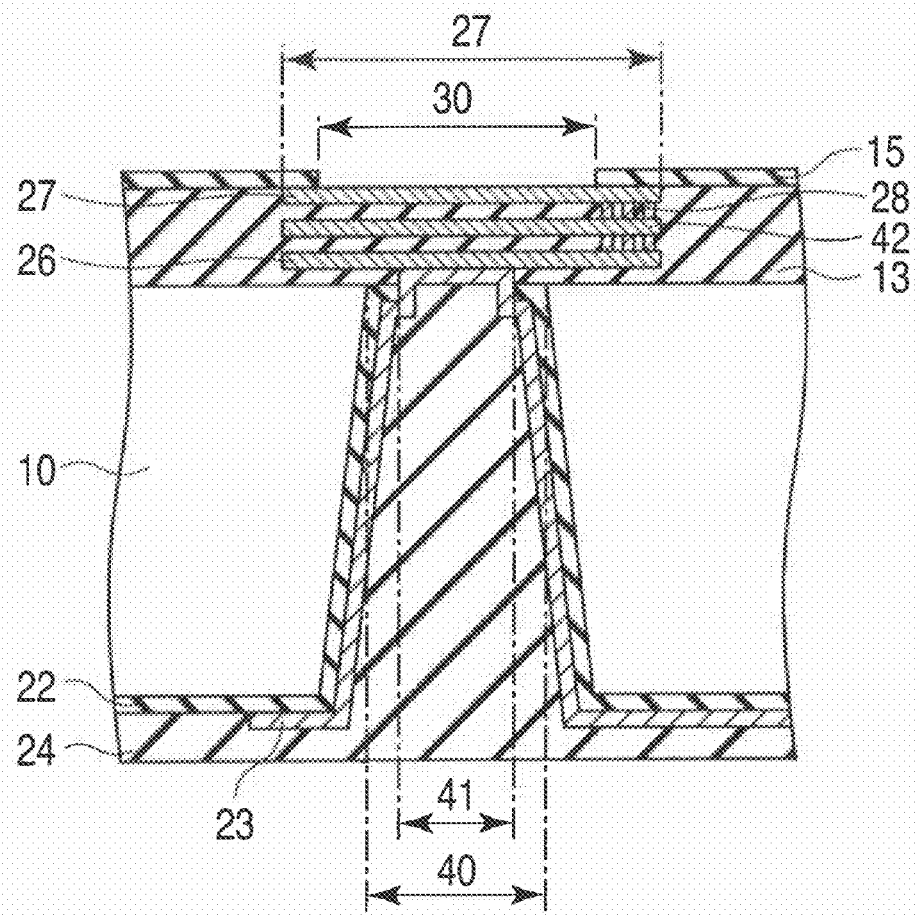
F I G. 13

SEMICONDUCTOR PACKAGE INCLUDING THROUGH-HOLE ELECTRODE AND LIGHT-TRANSMITTING SUBSTRATE

CROSS REFERENCE TO RELATED APPLICATIONS

This is a Continuation Application of PCT Application No. PCT/JP2008/073882, filed Dec. 19, 2008, which was published under PCT Article 21(2) in English.

This application is based upon and claims the benefit of priority from prior Japanese Patent Application No. 2007-338199, filed Dec. 27, 2007, the entire contents of which are incorporated herein by reference.

BACKGROUND OF THE INVENTION

1. Field of the Invention

The present invention relates to a semiconductor package including a through-hole electrode and light-transmitting substrate, e.g., a camera module.

2. Description of the Related Art

As electronic apparatuses become smaller, semiconductor devices to be incorporated into these electronic apparatuses must also be made smaller and more highly integrated. In the second half of the 1990's, the examination of putting a wafer level chip scale package (to be referred to as a wafer level CSP hereinafter) into practical use began (e.g., "Nikkei Micro Devices", April 1998, pp. 28, 164, and 176). In this package, a semiconductor chip is connected to a substrate by bumps with the chip surface facing down by using a flip-chip method using no lead wire.

On the other hand, a stacked package (multi-chip package) capable of achieving a very small size by three-dimensionally stacking a plurality of semiconductor chips has been developed since the last half of the 1990's, and a package using a through-hole electrode has been proposed (e.g., Jpn. Pat. Appln. KOKAI Publication No. 10-223833). The examination of the wafer level CSP of an optical element has begun around 2000. The structure of glass+adhesive layer+image sensor+through-hole electrode formed by Koyanagi et al. and a sectional photograph of the actually formed structure are described in "International Electron Devices Meeting 1999 Technical Digest", pp. 879-882. U.S. Pat. No. 6,489,675 has also disclosed the sectional structure of an optical element including a through-hole electrode and light-transmitting substrate. In any through-hole electrode, an electrode pad layer exists on the bottom of the through-hole electrode, and the electrode pad functions as a stopper for a via formed in silicon by anisotropic etching.

When forming the wafer level CSP of an optical element, the optical element is first formed in the form of a wafer, and whether each chip is good or bad is checked by a die sort test. In this test, the needle of a die sort tester touches an electrode pad in the uppermost layer of the optical element, and leaves a mark on the electrode pad. When the section of the mark on the electrode pad is observed, the electrode pad is largely scooped out into the form of a recess. If there is only one electrode pad layer and this electrode pad is used not only for the die sort test but also as the anisotropic etching stopper, a portion damaged and thinned by the die sort test does not function as the stopper any longer, and anisotropic etching breaks through the electrode pad.

To avoid this inconvenience, it is necessary to separately form an electrode pad for use in the die sort test and an electrode pad to be used as the anisotropic etching stopper. Jpn. Pat. Appln. KOKAI Publication No. 2007-53149 describes a structure in which two or more electrode pad layers are formed in an interlayer insulating film, and a contact plug electrically connects an element surface electrode in the uppermost layer and an internal electrode serving as an anisotropic etching stopper when forming a through-hole electrode, although the structure is not an optical element.

Unfortunately, this structure is a very rigid structure in which the contact plug exists over the entire surfaces of the internal electrode and element surface electrode. When the needle of the die sort test touches the element surface electrode of this structure, the electrode may sink into silicon and destroy the element because the electrode is too rigid. Also, if the needle and electrode are strongly adhered, the whole electrode may be removed together with the needle from the silicon substrate when the needle is removed.

BRIEF SUMMARY OF THE INVENTION

According to a first aspect of the present invention, there is provided a semiconductor package comprising: an imaging element formed on a first main surface of a semiconductor substrate; an external terminal formed on a second main surface opposite to the first main surface of the semiconductor substrate; a through-hole electrode which is formed in a through hole formed in the semiconductor substrate, and electrically connects the imaging element on the first main surface and the external electrode on the second main surface; a first electrode pad formed on the through-hole electrode in the first main surface of the semiconductor substrate; an interlayer insulating film formed on the first electrode pad and on the first main surface of the semiconductor substrate; a second electrode pad formed on the interlayer insulating film; a passivation film formed on the second electrode pad and the interlayer insulating film, and having an opening which exposes a portion of the second electrode pad; and a contact plug formed between the first electrode pad and the second electrode pad in a region which does not overlap the opening when viewed in a direction perpendicular to a surface of the semiconductor substrate.

According to a second aspect of the present invention, there is provided a semiconductor package comprising: an imaging element formed on a first main surface of a semiconductor substrate; an external terminal formed on a second main surface opposite to the first main surface of the semiconductor substrate; a through-hole electrode which is formed in a through hole formed in the semiconductor substrate, and electrically connects the imaging element on the first main surface and the external electrode on the second main surface; a first electrode pad formed on the through-hole electrode in the first main surface of the semiconductor substrate; an interlayer insulating film formed on the first electrode pad and on the first main surface of the semiconductor substrate; a second electrode pad formed on the interlayer insulating film; and a contact plug formed between the second electrode pad and the first electrode pad in a region which does not overlap the through-hole electrode when viewed in a direction perpendicular to a surface of the semiconductor substrate.

According to a third aspect of the present invention, there is provided a semiconductor package comprising: an imaging element formed on a first main surface of a semiconductor substrate; an external terminal formed on a second main surface opposite to the first main surface of the semiconductor substrate; a through-hole electrode which is formed in a through hole formed in the semiconductor substrate, and electrically connects the imaging element on the first main surface and the external electrode on the second main surface; a first electrode pad formed on the through-hole electrode in the first main surface of the semiconductor substrate; an interlayer insulating film formed on the first electrode pad and on the first main surface of the semiconductor substrate; a second electrode pad formed on the interlayer insulating film; a passivation film formed on the second electrode pad and the interlayer insulating film, and having an opening which exposes a portion of the second electrode pad; and a contact plug formed between the first electrode pad and the second electrode pad, the contact plug being positioned immediately below a portion of the second electrode pad, which is overlapped by the passivation film.

BRIEF DESCRIPTION OF THE SEVERAL VIEWS OF THE DRAWING

FIG. 11 is an enlarged sectional view of a through-hole electrode and electrode pad portion in a camera module of a second embodiment of the present invention;

FIG. 12 is a plan view of the through-hole electrode and electrode pad portion viewed from the pad opening side in the camera module of the second embodiment;

FIG. 13 is an enlarged sectional view of a through-hole electrode and electrode pad portion in a camera module of a third embodiment of the present invention;

DETAILED DESCRIPTION OF THE INVENTION

Embodiments of the present invention will be explained below with reference to the views of the accompanying drawing. A camera module will be taken as an example of a semiconductor package. In the following explanation, the same reference numbers denote the same parts throughout the drawings.

First Embodiment

First, a camera module of the first embodiment of the present invention will be explained below.

Figure 1:
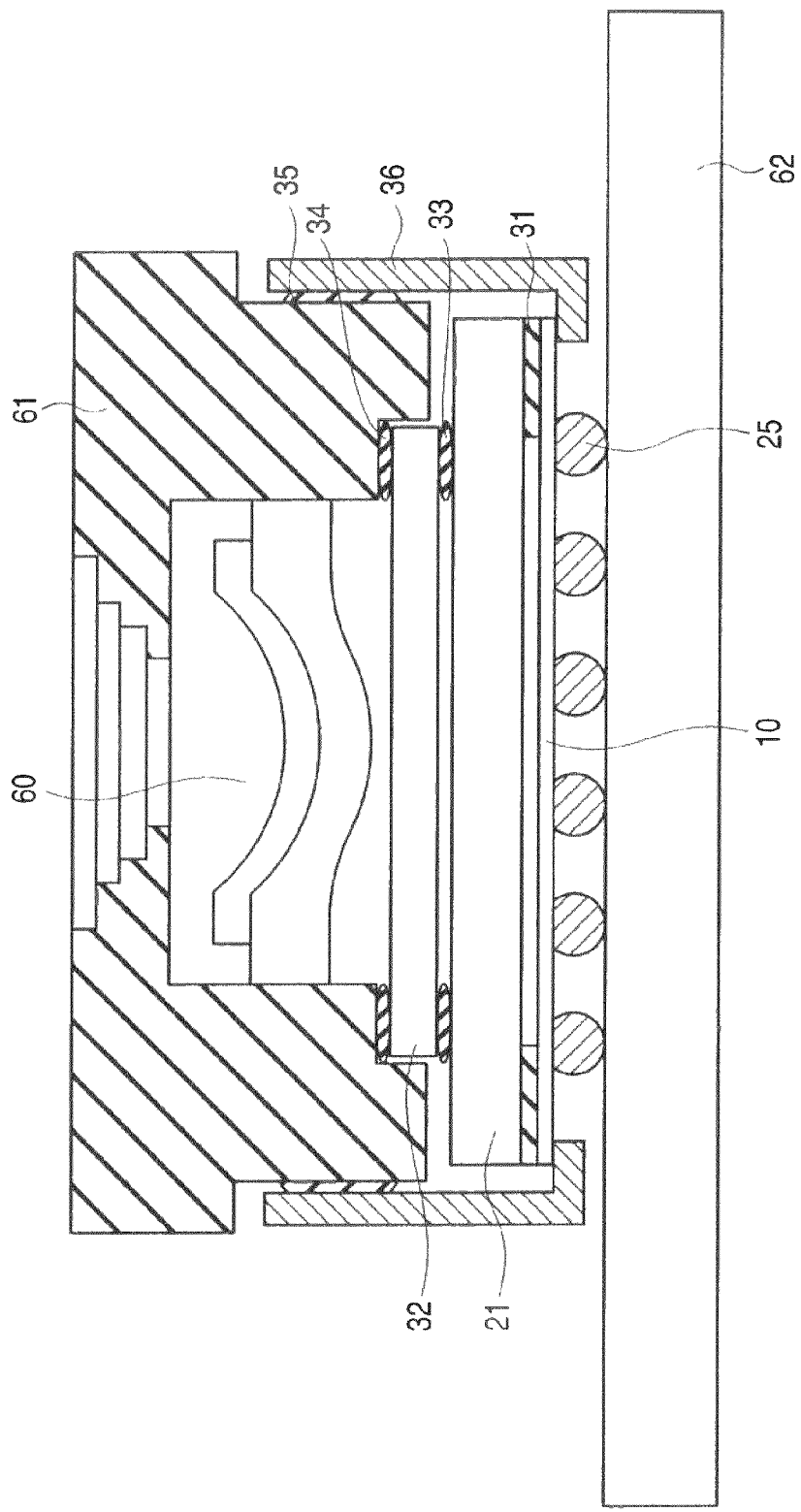
FIG. 1 is a sectional view showing the arrangement of a camera module of a first embodiment of the present invention.

FIG. 1 is a sectional view showing the arrangement of the camera module of the first embodiment. A light-transmitting substrate, e.g., a glass substrate 1 is formed on an adhesive 31 on the first main surface of a silicon semiconductor substrate (imaging element chip) 10 on which imaging elements (not shown) are formed. An infrared (IR) cut filter 32 is formed on an adhesive 33 on the glass substrate 21, and a lens holder 61 including an imaging lens 60 covers the IR cut filter 32 with an adhesive 34 being interposed between them. The camera module is formed by adhering these components. Also, external terminals, e.g., solder balls 25 are formed on the second main surface of the silicon semiconductor substrate 10. A light-shielding electromagnetic shield 36 is formed around the semiconductor substrate 10 and glass substrate 21. The light-shielding electromagnetic shield 36 is adhered to the lens holder 61 by an adhesive 35. After that, the silicon semiconductor substrate 10 is directly mounted (by chip-on-board [COB]) on a printed circuit board 62 made of a resin or ceramic with the solder balls 25 being interposed between them.

The sectional structure of the silicon semiconductor substrate 10 and glass substrate 21 shown in FIG. 1 will be explained in detail below.

Figure 2:
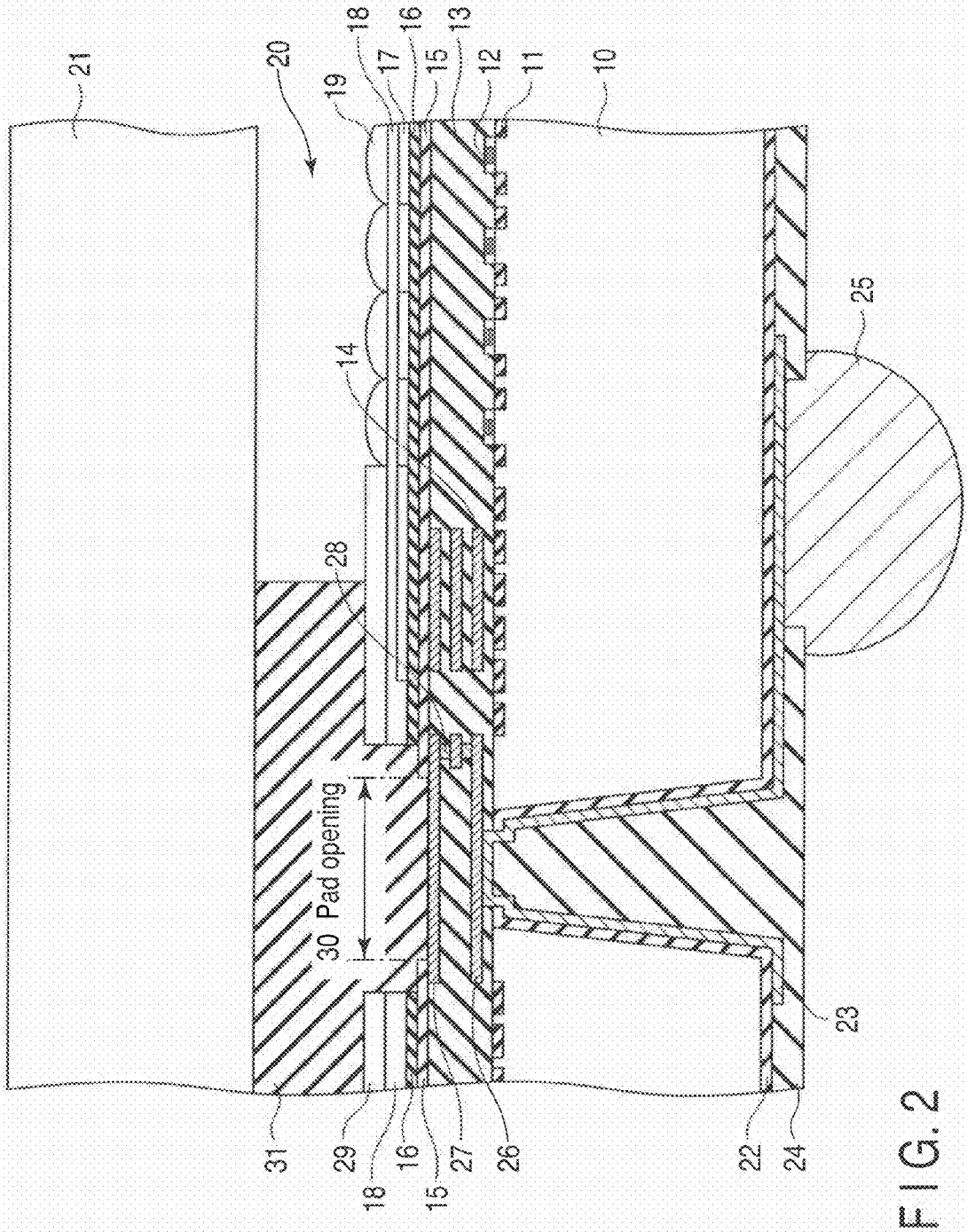
FIG. 2 is an enlarged sectional view of a silicon semiconductor substrate and glass substrate in the camera module of the first embodiment.

FIG. 2 is an enlarged sectional view of the silicon semiconductor substrate 10 and glass substrate 21 in the camera module. The camera module has an imaging pixel portion in which imaging elements 12 are formed, and a peripheral circuit portion for processing signals output from this imaging pixel portion.

The imaging pixel portion of the camera module has the following arrangement. Shallow trench isolations (STIs) 11 as element isolation insulating layers and element regions divided by the STIs 11 are arranged on the first main surface of the silicon semiconductor substrate 10. The imaging element 12 including a photodiode and transistor is formed in each element region. An interlayer insulating film 13 is formed on the first main surface on which the imaging elements 12 are formed. In addition, interconnections 14 are formed in the interlayer insulating film 13.

A passivation film 15 is formed on the interlayer insulating film 13, and a base layer 16 is formed on the passivation film 15. Color filters 17 are arranged on the base layer 16 so as to be opposed to the imaging elements 12. An overcoat 18 is formed on the color filters 17, and microlenses 19 are formed on the overcoat 18 so as to be opposed to the imaging elements 12 (color filters 17). A hollow 20 is formed on the microlenses 19, and the light-transmitting substrate (transparent substrate), e.g., the glass substrate 21 is placed on the hollow 20.

The individual parts described above are made of, e.g., the following materials. The STIs 11 are made of $SiO_2$, and the interlayer insulating film 13 is made of $SiO_2$ or SiN. The interconnections 14 are made of aluminum (Al), the color filters 17 are made of an acrylic resin, and the microlenses 19 are made of a styrene-based resin.

In the peripheral circuit portion of the camera module, a through-hole electrode and electrode pads as will be described below are formed. A through hole is formed in the silicon semiconductor substrate 10 from the second main surface opposite to the first main surface to the first main surface. An insulating film 22 is formed on the inner circumferential surface of the through hole and on the second main surface. A conductor layer 23 is formed on the insulating film 22. A protective film, e.g., a solder resist 24 is formed on the conductor layer 23. The solder resist 24 on the conductor layer 23 is partially open, and the solder ball 25 is formed on the exposed conductor layer 23.

The solder resist 24 is made of, e.g., a phenol-based resin, polyimide-based resin, or amine-based resin. The solder ball 25 is made of, e.g., Sn—Pb (eutectic), 95Pb—Sn (high-lead, high-melting-point solder), or Pb-free solder such as Sn—Ag, Sn—Cu, or Sn—Ag—Cu.

Also, the interlayer insulating film 13 is formed on the first main surface of the silicon semiconductor substrate 10. The conductor layer 23 formed in the through hole reaches the first main surface, and an internal electrode (first electrode pad) 26 is formed on the conductor layer 23. The internal electrode 26 is electrically connected to the imaging element 12 or a peripheral circuit (not shown) formed in the peripheral circuit portion. Accordingly, a through-hole electrode formed in the through hole electrically connects the solder ball 25 and the imaging element 12 or peripheral circuit.

An element surface electrode (second electrode pad) 27 is formed on the internal electrode 26 with the interlayer insulating film 13 being interposed between them. In the interlayer insulating film 13 between the internal electrode 26 and element surface electrode 27, a contact plug 28 for electrically connecting these electrodes is formed. The element surface electrode 27 is used to apply a voltage or read out a signal via the contact plug 28 and internal electrode 26. Especially when performing a die sort test, a needle is brought into contact with the element surface electrode 27.

The passivation film 15 is formed on the element surface electrode 27. The base layer 16 is formed on the passivation film 15, and the overcoat 18 is formed on the base layer 16. In addition, a styrene-based resin layer 29 is formed on the overcoat 18. A pad opening 30 is formed through the passivation film 15, base layer 16, overcoat 18, and styrene-based resin layer 29 formed on the element surface electrode 27.

The glass substrate 21 is formed on the adhesive 31 on the styrene-based resin layer 29 and element surface electrode 27. Note that the adhesive 31 is patterned and is not formed on the imaging elements 12 (microlenses 19).

In the structure as described above, the above-mentioned contact plug 28 is formed in a position where the contact plug 28 does not overlap the pad opening 30 or through-hole electrode in a direction perpendicular to the surface of the silicon substrate 10.

Figure 3:
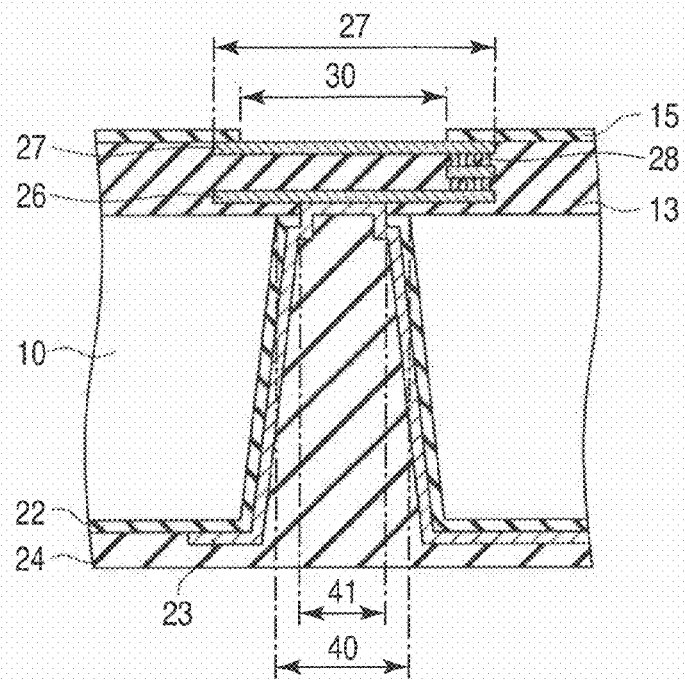
FIG. 3 is an enlarged sectional view of a through-hole electrode and electrode pad portion in the camera module of the first embodiment.
Figure 4:
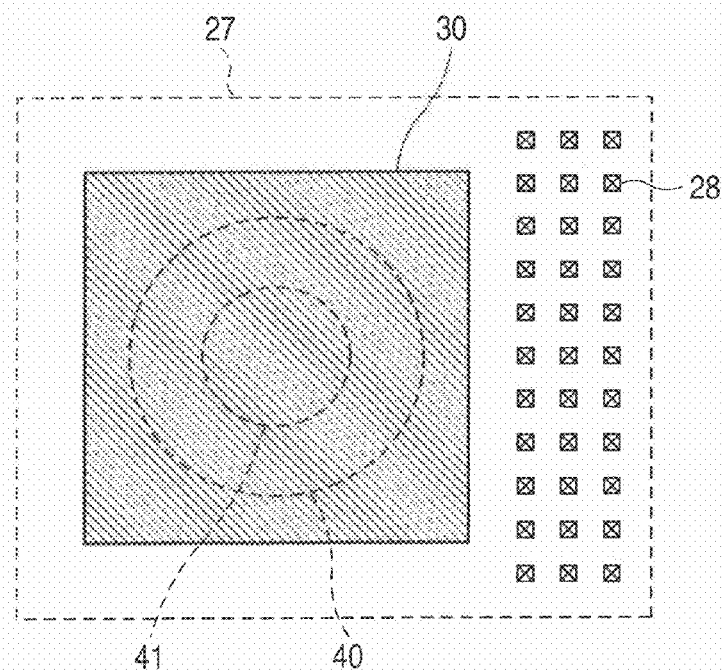
FIG. 4 is a plan view of the through-hole electrode and electrode pad portion viewed from the pad opening side in the camera module of the first embodiment.

Next, the through-hole electrode and electrode pad portion in the camera module of the first embodiment will be explained in detail below. FIG. 3 is an enlarged sectional view of the through-hole electrode and electrode pad portion in the camera module. FIG. 4 is a plan view of the through-hole electrode and electrode pad portion viewed from the pad opening side. Note that FIGS. 3 and 4 illustrate the structure up to the passivation film 15 formed on the interlayer insulating film 13, and do not show any members formed on the passivation film 15.

The through hole is formed in the silicon semiconductor substrate 10 from the second main surface to the first main surface. The insulating film 22 for insulating the silicon substrate 10 from the conductor layer 23 is formed on the surface of the through hole.

A method of forming the through-hole electrode will be briefly explained below. First, a through hole is formed in the silicon substrate 10, and the insulating film 22 is formed in this through hole. After that, the insulating film existing between the internal electrode 26 and silicon substrate 10 and the insulating film 22 are simultaneously processed. Accordingly, a plateau made of the insulating film exists. Reference number 40 denotes the processed hole (through hole) formed on the side of the interlayer insulating film 13 by processing the silicon substrate 10; and 41, the processed hole formed by processing the insulating film 22. In this case, as shown in FIGS. 3 and 4, the processed hole 41 necessarily exists in the processed hole 40, and the processed hole 40 necessarily exists in the pad opening 30.

As shown in FIG. 4, the contact plugs 28 are formed between the internal electrode 26 and the region of the element surface electrode 27 except for the pad opening 30. In other words, the contact plugs 28 are formed in that portion between the element surface electrode 27 and internal electrode 26, which does not overlap the pad opening 30 when viewed in the direction perpendicular to the surface of the silicon substrate 10. Also, the contact plugs 28 are formed in that portion between the element surface electrode 27 and internal electrode 26, which does not overlap the through hole (through-hole electrode) 40 when viewed in the direction perpendicular to the surface of the silicon substrate 10.

The conductor layer 23 of the through-hole electrode extends from that surface of the internal electrode 26, which faces the silicon substrate 10 to a portion of the insulating film 13, the surface of the insulating film 22, and the second main surface of the silicon substrate 10. The solder resist 24 exists on the conductor layer 23 and is partially open, and the solder ball (not shown) 25 is formed in this opening so as to be connected to the conductor layer 23.

In the first embodiment having the structure described above, even when a needle touches the element surface electrode (second electrode pad) 27 during a die sort test and the element surface electrode 27 is scratched and thinned or broken, i.e., even when the element surface electrode 27 is damaged, the internal electrode 26 can be used as an etching stopper in anisotropic etching in the step of removing the insulating film on the bottom of the through hole formed in the silicon substrate 10. This makes it possible to prevent the inconvenience that the etchant of anisotropic etching breaks through the internal electrode (electrode pad) 26.

Also, if the contact plugs 28 exist throughout the portion between the internal electrode 26 and element surface electrode 27, a portion of the element surface electrode 27 or internal electrode 26 may enter the interior of the silicon substrate 10 and destroy the camera module because the portion between the electrodes is too rigid, when the needle touches the element surface electrode 27 during the die sort test. Furthermore, if the needle strongly attaches to the element surface electrode 27 and internal electrode 26, these electrodes may be removed from the silicon substrate 10 when the needle is detached. In the first embodiment, the contact plugs 28 are not formed throughout the portion between the internal electrode 26 and element surface electrode 27, but are arranged between the internal electrode 26 and element surface electrode 27 except for the pad opening 30 or through-hole electrode when viewed from above the pad opening, so the portion between these electrodes does not become too rigid. Accordingly, it is possible to reduce the aforesaid inconveniences, i.e., the inconvenience that a portion of the element surface electrode 27 or internal electrode 26 enters the interior of the silicon substrate 10 and destroys the camera module, and the inconvenience that the element surface electrode 27 and internal electrode 26 are removed from the silicon substrate 10 when the needle is detached.

Note that although the two electrode pads (internal electrode 26 and element surface electrode 27) are formed in this embodiment, at least two electrode pads need only be formed. For example, one or a plurality of electrode pads may also be arranged in the interlayer insulating film 13 between the internal electrode 26 and element surface electrode 27. Note also that the three layers of the interconnections 14 are formed in the interlayer insulating film 13.

In the pad opening 30 on the element surface electrode 27, the position of the opening edge of the passivation film 15 differs from those of the opening edges of the base layer 16, overcoat 18, and styrene-based resin layer 29, thereby forming a step. However, the positions of these opening edges may also be aligned. The opening edges of the overcoat 18 and styrene-based resin layer 29 may or may not have a step. Furthermore, the pad opening 30 is formed through the passivation film 15, base layer 16, overcoat 18, and resin layer 29 on the element surface electrode 27. However, it is also possible to use a structure in which no pad opening is formed through these films.

Figure 5:
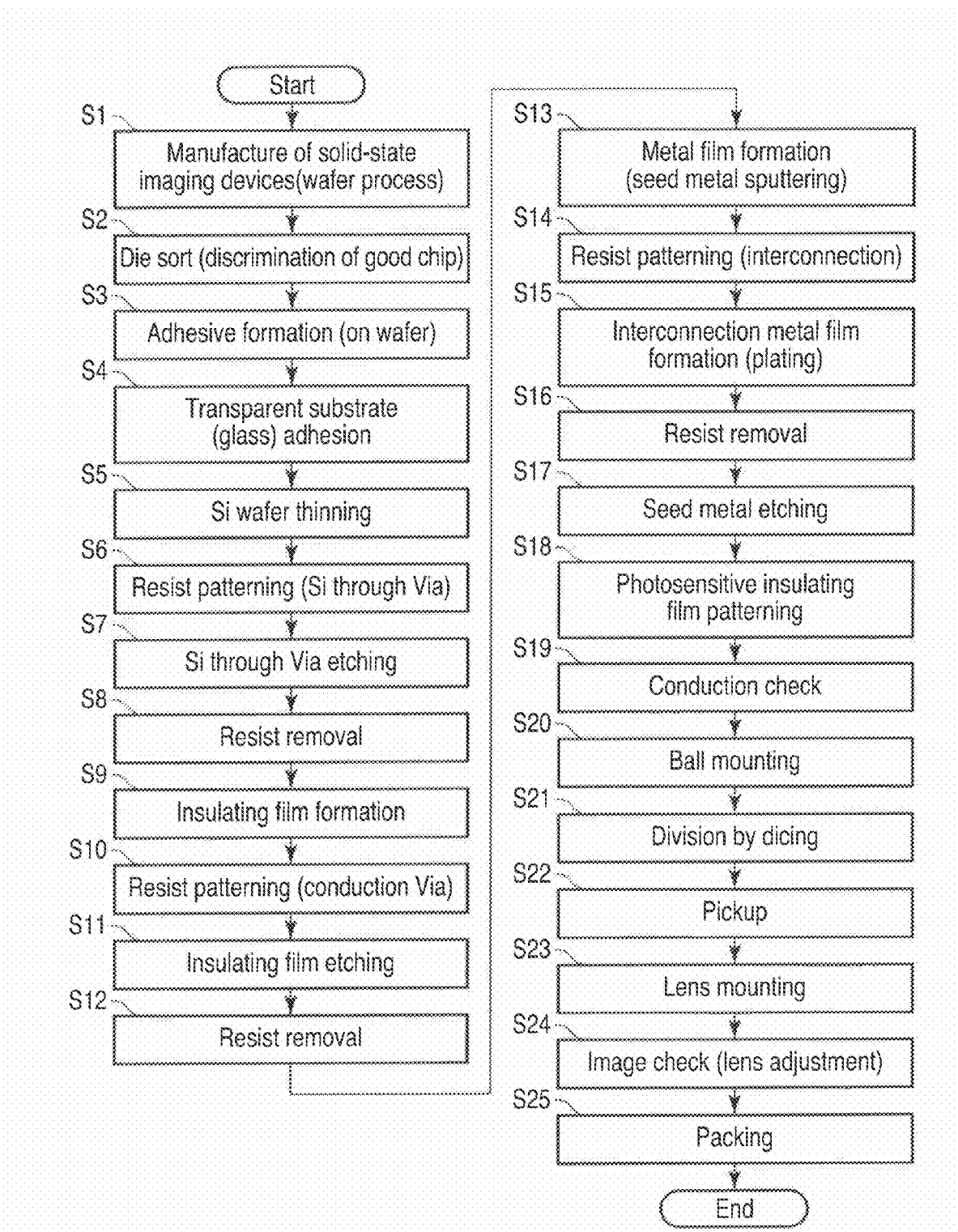
FIG. 5 is a process flowchart showing a method of manufacturing the camera module of the first embodiment.

A method of manufacturing the camera module of the first embodiment of the present invention will be explained below. FIG. 5 is a process flowchart showing the camera module manufacturing method of the first embodiment. FIGS. 6 to 10 illustrate the sectional structure of a part of a chip including the electrode pads of the camera module, and express processing of the whole wafer surface.

Figure 6:
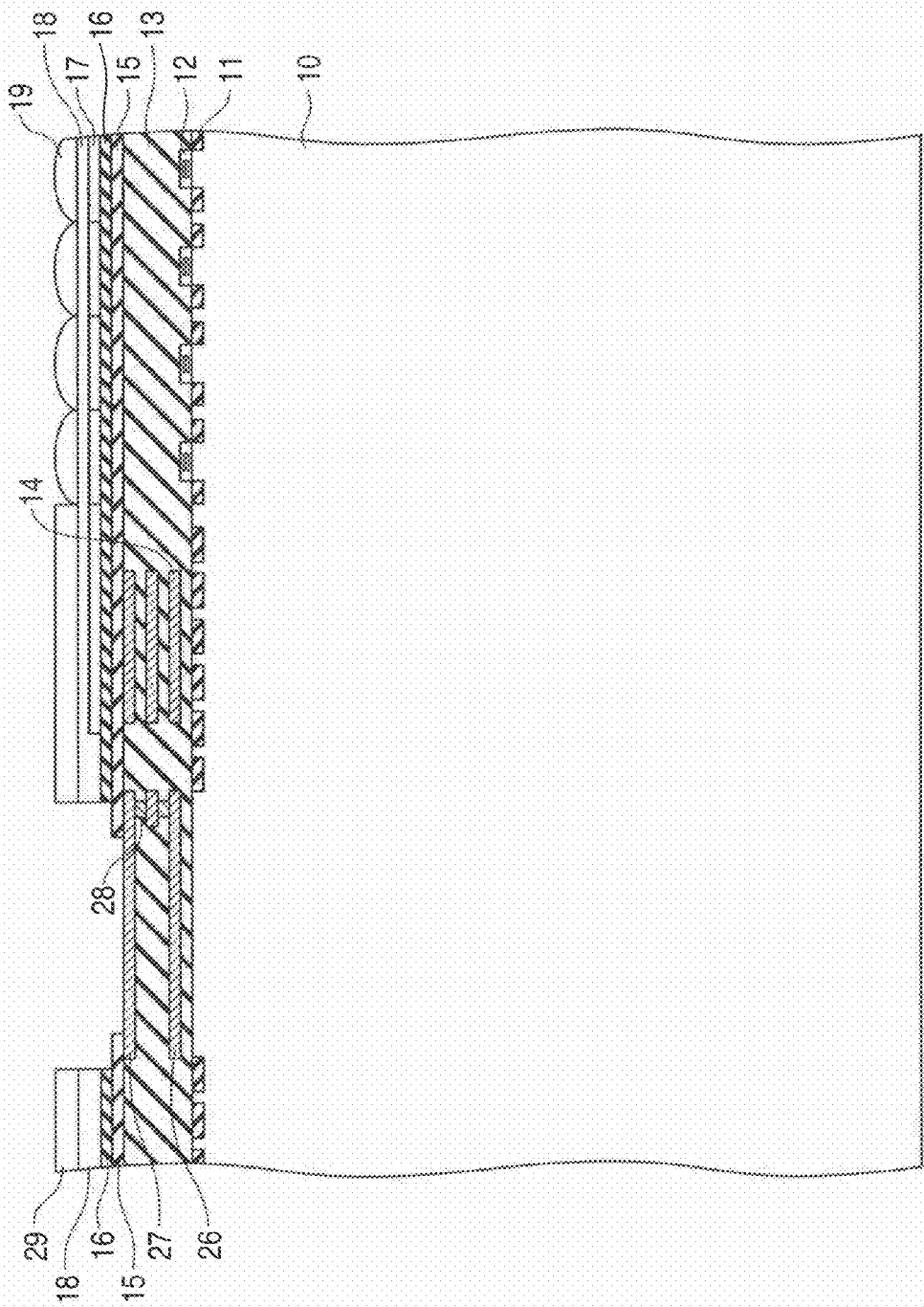
FIG. 6 is a sectional view of a first step showing the method of manufacturing the camera module of the first embodiment.

First, as shown in FIG. 6, solid-state imaging devices are formed on a silicon semiconductor substrate (wafer) 10 (step S1). That is, imaging elements 12 each including a photodiode and transistor are formed on the silicon substrate 10. In addition, an internal electrode 26, an interlayer insulating film 13, an element surface electrode 27, color filters 17, and microlenses 19 are formed on the silicon substrate 10. Subsequently, a die sort test is conducted on each chip including the imaging elements 12, thereby checking whether the chip normally operates (step S2). In the die sort test, the needle of a tester touches the element surface electrode 27.

Then, an adhesive 31 is formed on the first main surface (element formation surface) of the silicon substrate 10 by spin coating or lamination. The adhesive 31 has a function of allowing patterning by lithography and a function of holding the patterned shape, in addition to an adhering function. The adhesive 31 formed on the silicon substrate 10 is patterned by lithography such that the imaging elements 12 are exposed, i.e., the adhesive 31 is not formed on the imaging elements 12 (step S3). After that, the silicon substrate 10 having the adhesive 31 is adhered to a glass substrate 21 (step S4).

Figure 7:
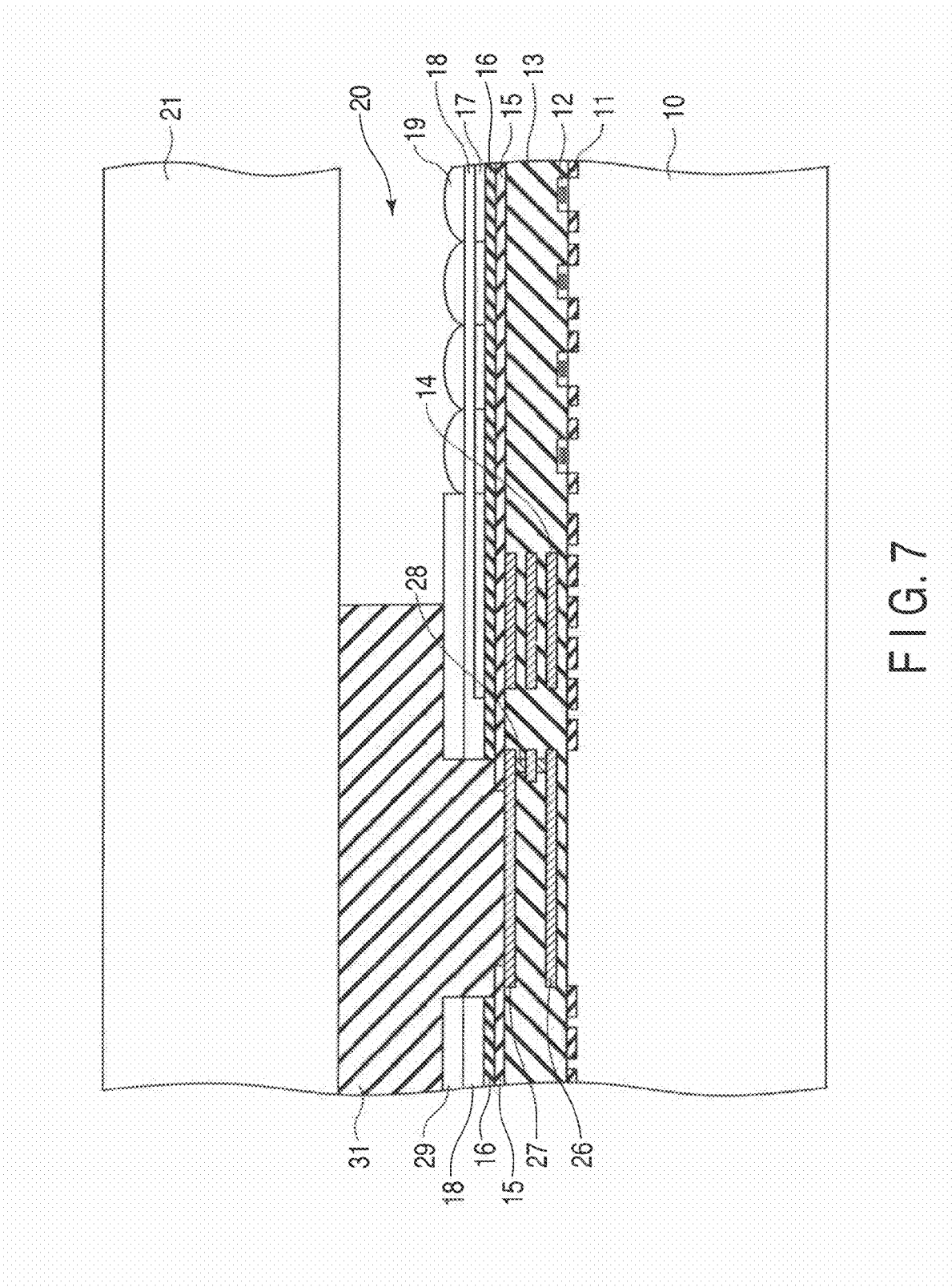
FIG. 7 is a sectional view of a second step showing the method of manufacturing the camera module of the first embodiment.

The silicon substrate 10 is then thinned by scraping the second main surface by back grinding or the like (step S5) (FIG. 7). Streaks remain on the back-ground silicon surface, and the surface roughness reaches a few μm to 10 μm. If the process directly advances to lithography and RIE in the subsequent step, a lithography error or RIE error may occur. Therefore, the second main surface is desirably planarized by chemical mechanical polishing (CMP) or wet etching.

Also, the variation in thickness of the silicon substrate 10 must fall within the range of average value ±5 μm. If the thickness of the silicon substrate varies in the plane, insufficient etching occurs in a portion where silicon is thick and a scoop called notching is formed on the bottom of a portion where silicon is thin in the next RIE step.

Figure 8:
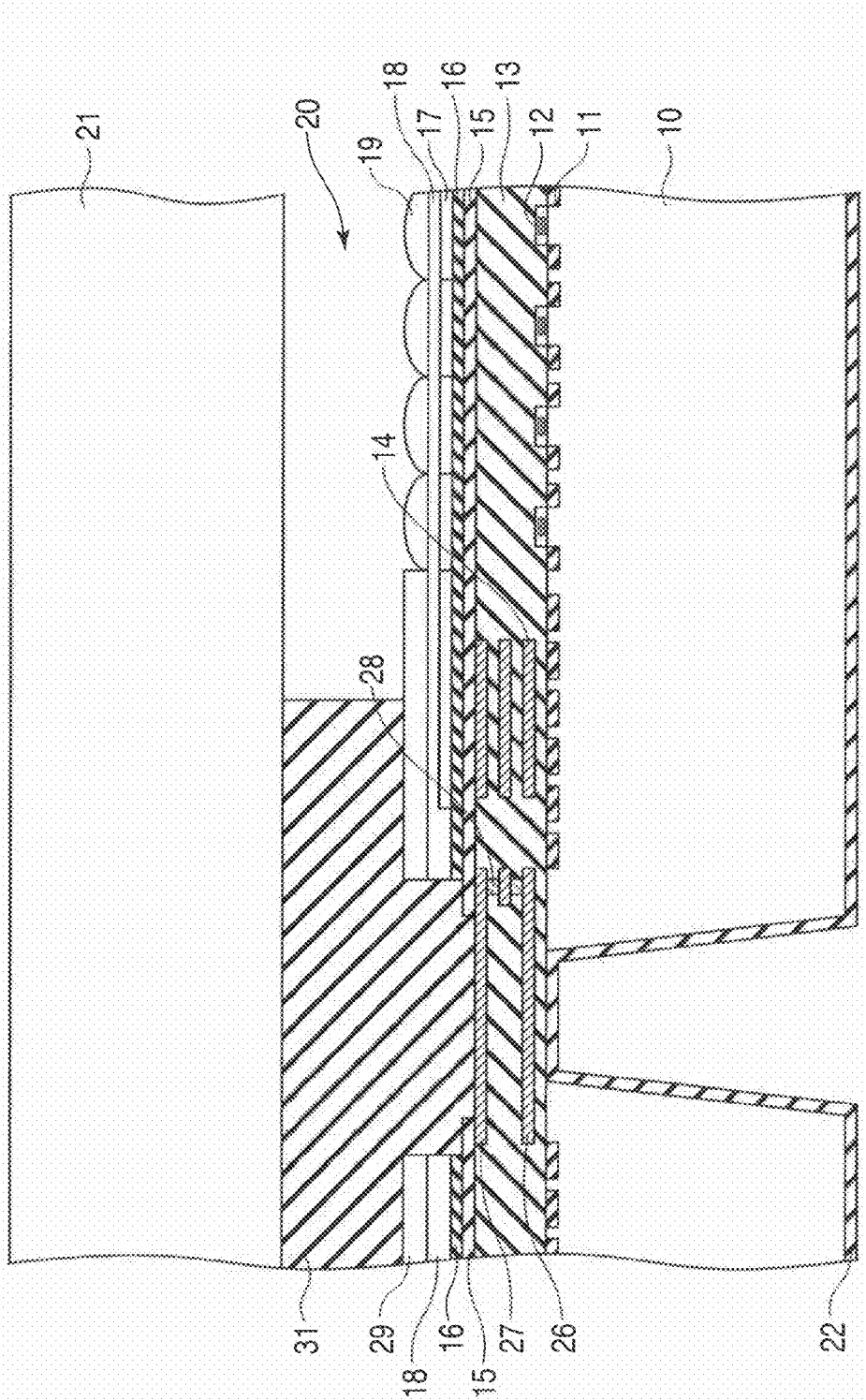
FIG. 8 is a sectional view of a third step showing the method of manufacturing the camera module of the first embodiment.

Then, the second main surface of the silicon substrate 10 is coated with a resist, and a hole is formed by lithography in a position opposite to a pad opening 30 in the first main surface of the silicon substrate 10 (step S6). In this step, a means such as a double-side aligner or double-side stepper must be used in order to align the opening in the second main surface with an alignment mark (not shown) on the first main surface. Subsequently, a though hole is formed by using the patterned resist as a mask (step S7) (FIG. 8).

First, only silicon of the silicon substrate 10 is etched by RIE. A silicon device process of forming the imaging elements 12 and transistors normally advances in the order of well formation, shallow trench isolation (STI) formation, source/drain formation, gate/electrode formation, and interconnection formation. In STI formation, neither a silicon hill exceeding a certain size nor a shallow trench exceeding a certain size is desirably formed for the following reasons. If a large-size silicon hill exists during CMP, a CMP residue may be produced on the hill. If a large-size shallow trench exists, over-polishing may occur in the trench. In either case, misalignment may occur in the subsequent lithography step, or disconnection of metal interconnections in an upper layer may occur. Therefore, a dummy STI is normally formed in a portion of the silicon substrate where a giant pattern such as an electrode pad is to be formed.

When forming a through-hole electrode, however, it is important to form no STI below an electrode pad. This is so because the type of gas of RIE of silicon differs from that of gas of RIE of an insulating film. That is, if an insulating film pattern exists in silicon during RIE of silicon, an etching error may occur in this portion to form a frog-like etching residue. If a CMP residue is inevitably produced below an electrode pad during CMP of the STI, it is necessary to form a hole by lithography in the portion where the residue is produced, and perform CMP after the material is partially etched by wet etching or the like, thereby eliminating the CMP residue.

Also, the shape of the through hole formed in the silicon substrate by RIE is desirably a tapered shape that gradually narrows from the opening in the second main surface toward the interior. If an inverse taper is formed by notching or bowing, an error may occur in the formation of an insulating film by CVD or in the formation of a metal seed layer by sputtering.

A layer of the interlayer insulating film 13, which is in direct contact with the silicon substrate 10, or the gate insulating film formed on the silicon substrate serves as a stopper in RIE of silicon. Subsequently, the resist is removed by ashing and wet etching (step S8). The RIE residue is preferably removed by performing HF-based wet cleaning after silicon RIE or resist removal.

Then, an insulating film 22 made of $SiO_2$, SiON, or SiN is formed on the entire second main surface by chemical vapor deposition (CVD) or the like (step S9) (FIG. 8).

A resist is applied again, a hole is formed in only the bottom of the through hole in the silicon substrate (step S10), and RIE of the insulating film 22 is performed by using the resist as a mask (step S11). In this RIE of the insulating film 22, the preformed CVD insulating film and all the insulating films formed between the silicon substrate 10 and internal electrode 26 by the silicon device process are etched. In this step, the internal electrode 26 functions as a stopper during RIE of the insulating films.

Subsequently, the resist is removed by ashing and wet cleaning (step S12). Note that the surface of the internal electrode 26 is desirably slightly etched by alkali-based wet etching because the surface may be oxidized by about a few nm to a few ten nm.

A metal seed layer is formed on the insulating film 22 and internal electrode 26 by sputtering (step S13). In this sputtering process, the oxide layer on the surface of the internal electrode 26 is preferably removed first by reverse sputtering. Subsequently, a metal seed such as Ti or Cu is sputtered. Note that to prevent corrosion on the surface of the internal electrode 26, the time between RIE of the insulating film 22 and metal seed sputtering is desirably 3 hrs or less, and 24 hrs or less at longest.

Figure 9:
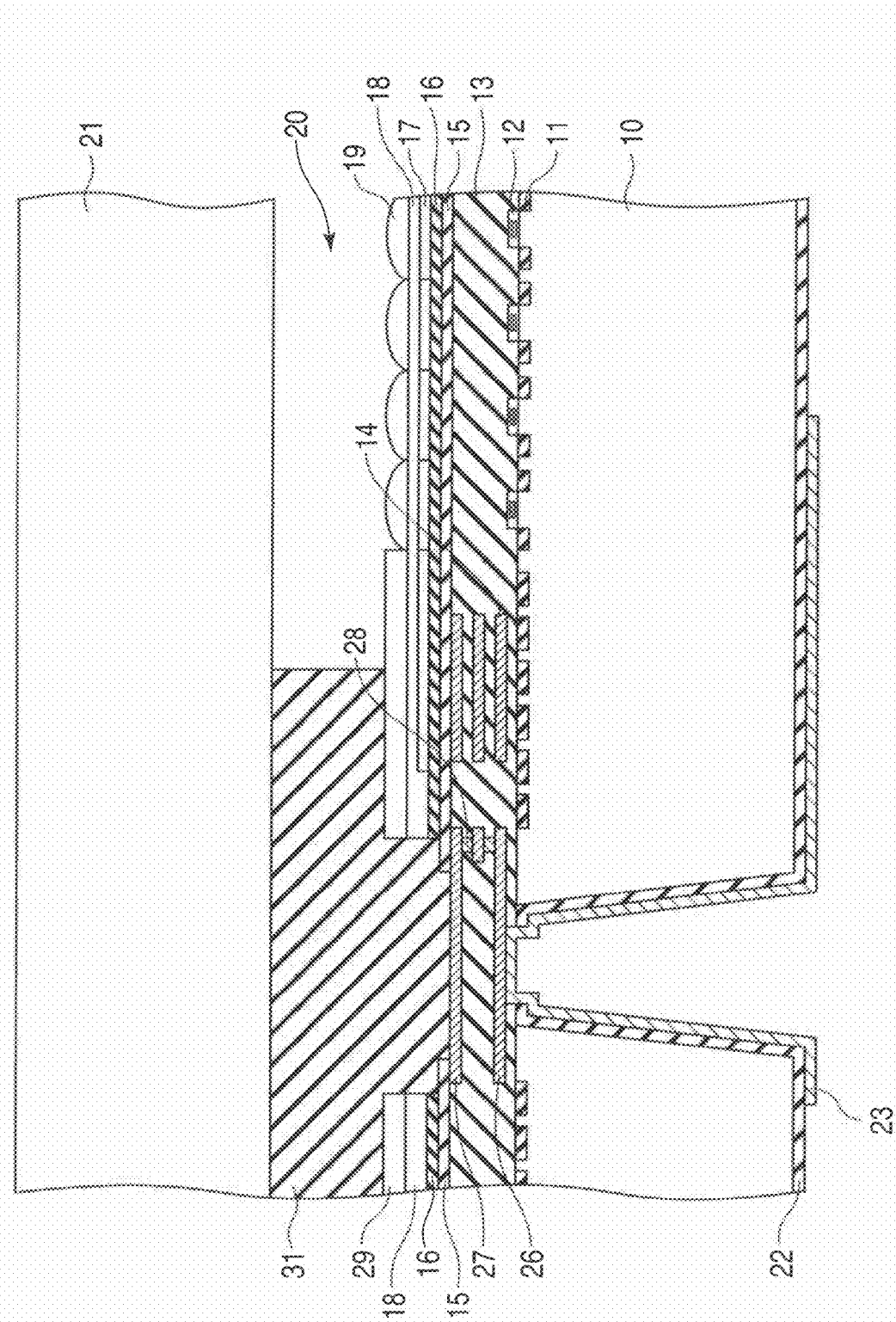
FIG. 9 is a sectional view of a fourth step showing the method of manufacturing the camera module of the first embodiment.

Then, a resist is applied for electrode patterning on the second main surface, and patterned by lithography so as to be left behind in only a portion where no electrode is to be formed (step S14). The metal seed layer is plated by electroplating or the like, and a through-hole electrode and interconnections are formed (step S15). After that, the resist is removed by wet etching or the like (step S16). Subsequently, the metal seed is etched by, e.g., wet cleaning, thereby exposing the insulating film 22 in regions except for the through-hole electrode and interconnections (step S17) (FIG. 9). Note that it is also possible to first perform non-masking electroplating, and then form the through-hole electrode and interconnections by lithography and etching. If this method is used, however, the amount of plating solution to be used increases, and this makes the process expensive.

Figure 10:
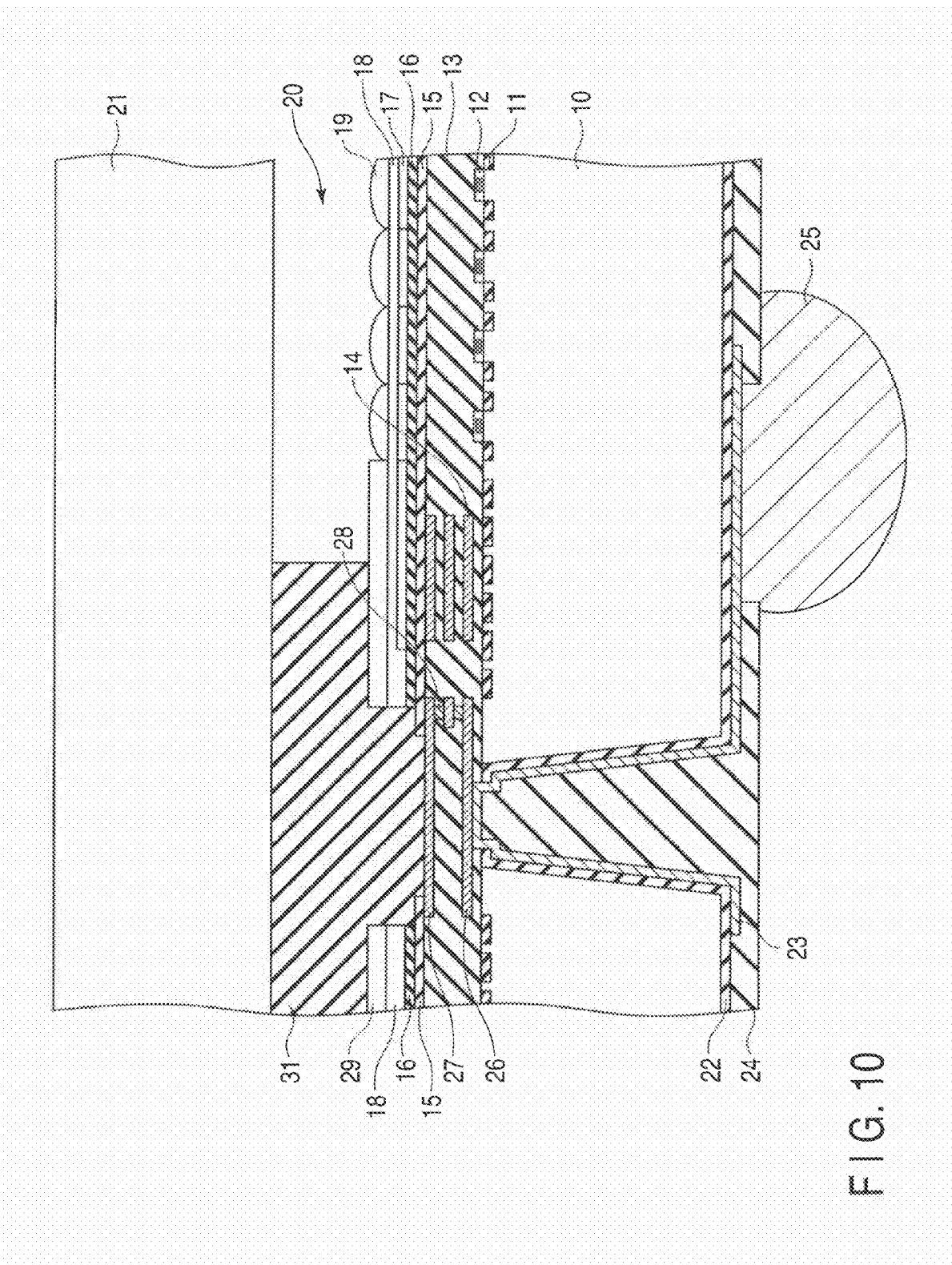
FIG. 10 is a sectional view of a fifth step showing the method of manufacturing the camera module of the first embodiment.

Then, a solder resist 24 is formed on the entire second main surface by, e.g., spin coating. A hole is formed in the solder resist 24 by lithography in only a region on which a solder ball 25 is to be mounted (step S18). After that, conduction check is performed (step S19), and the solder ball 25 is mounted on a conductor layer 23 in the hole of the solder resist 24 (step S20) (FIG. 10).

Finally, the silicon substrate 10 is divided by dicing (step S21), and pickup (step S22), lens mounting (step S23), and image check (lens adjustment) (step S24) are performed. After that, the manufacture of the camera module is completed by packing it up (step S25).

In the embodiment of the present invention, a glass substrate is used as the light-transmitting substrate, and a temperature of 100° C. to 200° C. is applied to the substrate when curing various resists or performing CVD. If the thermal expansion coefficients of silicon and glass are different, therefore, the silicon substrate 10 cracks or breaks. Accordingly, it is necessary to use glass having a thermal expansion coefficient which is almost equal to that of silicon. Also, glass having a thermal expansion coefficient almost equal to that of silicon is normally an insulator having a high resistance. However, a sample being processed is held not by a mechanical chuck but by an electrostatic chuck in an RIE apparatus, asher apparatus, sputtering apparatus, and the like. In this case, a glass substrate cannot be held by the electrostatic chuck. To avoid this inconvenience, a conductive film or plate must be adhered on the glass surface, or the glass surface must be spin-coated with a conductive liquid.

In the first embodiment as has been explained above, even when the needle touches and damages the element surface electrode (second electrode pad) 27 during the die sort test, the internal electrode 26 can be used as an etching stopper in anisotropic etching for removing the insulating film on the bottom of the through hole formed in the silicon substrate 10. Therefore, it is possible to prevent the inconvenience that the etchant of anisotropic etching breaks through the internal electrode 26 and corrodes the interlayer insulating film 13.

Also, in the first embodiment, the contact plugs 28 are not formed throughout the portion between the internal electrode 26 and element surface electrode 27, and are arranged between the element surface electrode 27 and internal electrode 26 in the region that does not overlap the pad opening 30 or through-hole electrode when viewed in the direction perpendicular to the surface of the silicon substrate 10. Accordingly, the portion between these electrodes does not become too rigid. This makes it possible to reduce the inconvenience that a portion of the element surface electrode 27 or internal electrode 26 enters the interior of the silicon substrate 10 and destroys the camera module, and the inconvenience that the element surface electrode 27 or internal electrode 26 is removed from the silicon substrate 10 when the needle is detached.

Second Embodiment

A camera module of the second embodiment of the present invention will be explained below. The same reference numbers as in the arrangement of the above-mentioned first embodiment denote the same parts, and a repetitive explanation will be omitted.

FIG. 11 is an enlarged sectional view of a through-hole electrode and electrode pad portion in the camera module of the second embodiment. FIG. 12 is a plan view of the through-hole electrode and electrode pad portion viewed from the pad opening side. Note that FIGS. 11 and 12 illustrate the structure up to a passivation film 15 formed on an interlayer insulating film 13, and do not show any members formed on the passivation film 15.

In the second embodiment as shown in FIG. 12, the shape of a processed hole 50 in a silicon substrate 10 and that of a processed hole 51 in an insulating film 22 is a square. The rest of the arrangement and the effects are the same as those of the first embodiment described above.

Third Embodiment

A camera module of the third embodiment of the present invention will be explained below. The same reference numbers as in the arrangement of the above-mentioned first embodiment denote the same parts, and a repetitive explanation will be omitted. FIG. 13 is an enlarged sectional view of a through-hole electrode and electrode pad portion in the camera module of the third embodiment.

In the third embodiment as shown in FIG. 13, an intermediate electrode (third electrode pad) 42 is formed in an interlayer insulating film 13 between an internal electrode 26 and element surface electrode 27. That is, the third embodiment has a structure in which the number of electrode layers formed in the interlayer insulating film 13 is three, and the three layers of electrode pads are arranged in an electrode pad region.

In the third embodiment having this structure, even when a needle touches and damages the element surface electrode 27 during a die sort test, this damage by the needle does not reach the internal electrode 26 below the intermediate electrode 42 because the intermediate electrode 42 is formed below the element surface electrode 27, so the internal electrode 26 can be used as an etching stopper. The rest of the arrangement and the effects are the same as those of the first embodiment described previously.

The use of the electrode pad structure of the embodiment of the present invention makes it possible to implement a semiconductor package having high RIE stoppability and high die sort testability. Also, the through-hole electrode width is as large as a few ten μm, whereas the thickness of the interlayer insulating film 13 is as small as a few μm. Therefore, the electrode pad portion that comes in direct contact with the adhesive 31 may bend. In this case, if the contact plugs 28 exist immediately below the electrode pad in contact with the adhesive 31, the contact plugs may be broken when the bending force is applied. The embodiment of the present invention avoids this inconvenience caused by bent of the electrode pad.

Note that in the embodiment described above, the insulating film on the bottom of the through hole is etched by using the resist pattern in the step of forming the through-hole electrode in the silicon substrate. However, the insulating film on the bottom of the through hole may also be etched by non-masking anisotropic etching without using any resist pattern. Details of these steps will be described below.

Figure 14:
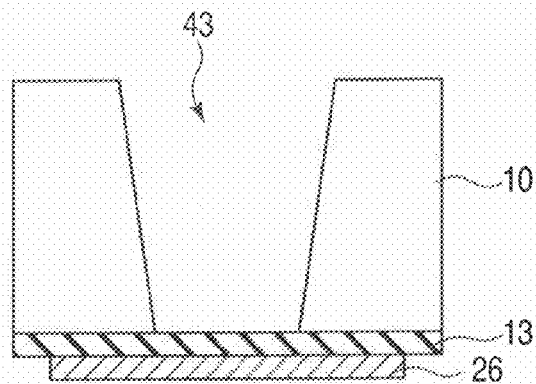
FIG. 14 is a sectional view of a first step showing a method of forming a through-hole electrode in a silicon semiconductor substrate according to an embodiment of the present invention.
Figure 15:
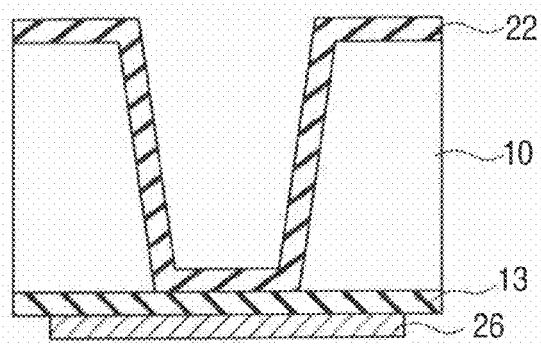
FIG. 15 is a sectional view of a second step showing the method of forming a through-hole electrode in a silicon semiconductor substrate according to the embodiment of the present invention.

FIGS. 14 to 18 are sectional views showing the steps of forming the through-hole electrode in the silicon substrate explained in the above embodiment. Note that in FIGS. 14 to 18, the upper surface of the silicon substrate 10 is the second main surface, and the lower surface of the silicon substrate 10 is the first main surface. As shown in FIG. 14, a through hole 43 is formed in the silicon substrate 10. Subsequently, as shown in FIG. 15, an insulating film 22 is formed in the through hole 43 and on the second main surface.

Figure 16:
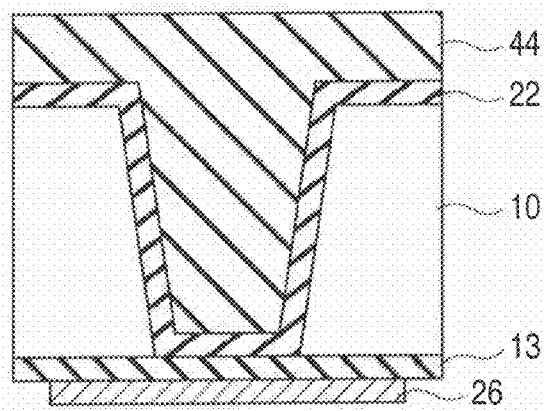
FIG. 16 is a sectional view of a third step showing the method of forming a through-hole electrode in a silicon semiconductor substrate according to the embodiment of the present invention.
Figure 17:
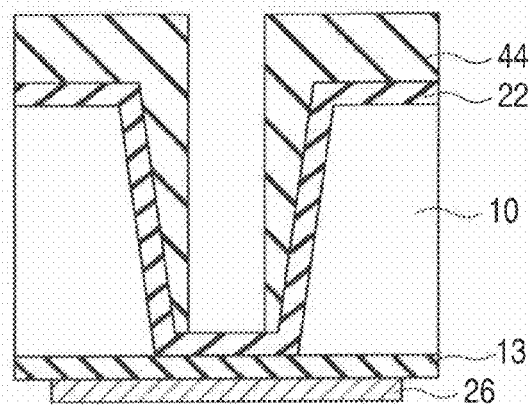
FIG. 17 is a sectional view of a fourth step showing the method of forming a through-hole electrode in a silicon semiconductor substrate according to the embodiment of the present invention.
Figure 18:
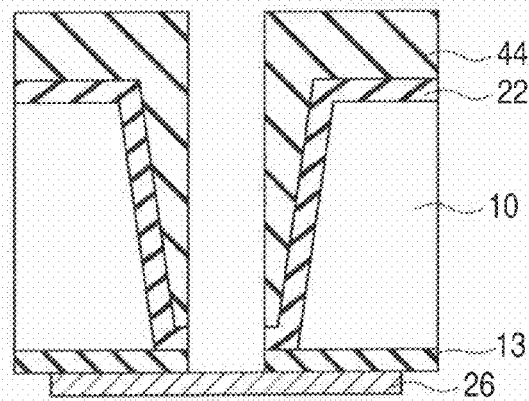
FIG. 18 is a sectional view of a fifth step showing the method of forming a through-hole electrode in a silicon semiconductor substrate according to the embodiment of the present invention.

After that, the insulating film 22 is coated with a resist 44 as shown in FIG. 16, and the resist 44 is patterned by photolithography as shown in FIG. 17. As shown in FIG. 18, the resist 44 is used to etch the insulating films 22 and 13 on the bottom of the through hole. After that, the resist 44 is removed, and a conductor layer 23 is formed on the insulating film 22 and on the internal electrode 26 on the bottom of the through hole.

Figure 19:
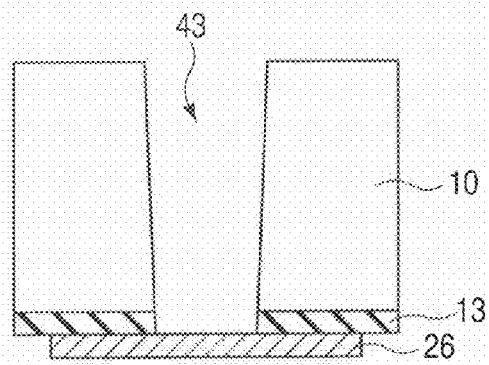
FIG. 19 is a sectional view of a first step showing a method of forming a through-hole electrode in a silicon semiconductor substrate according to another embodiment of the present invention.
Figure 20:
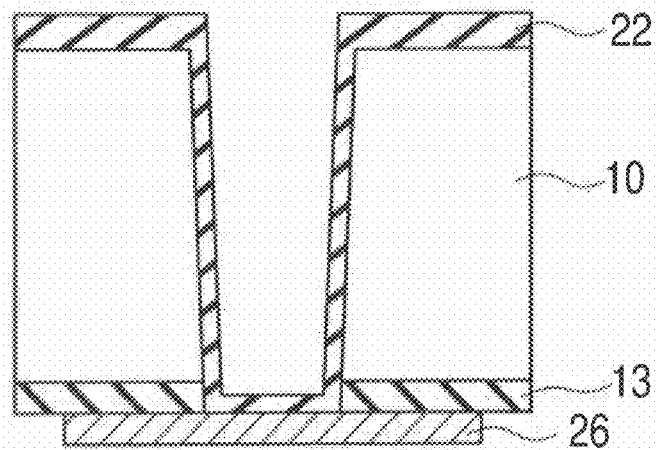
FIG. 20 is a sectional view of a second step showing the method of forming a through-hole electrode in a silicon semiconductor substrate according to the other embodiment of the present invention.
Figure 21:
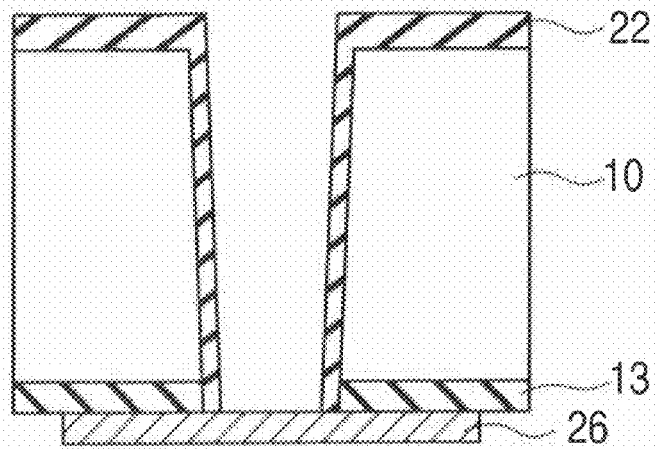
FIG. 21 is a sectional view of a third step showing the method of forming a through-hole electrode in a silicon semiconductor substrate according to the other embodiment of the present invention.

As described previously, the insulating film on the bottom of the through hole may also be etched by anisotropic etching using no resist. FIGS. 19 to 21 are sectional views showing the steps of forming a through hole in the silicon substrate 10.

As shown in FIG. 19, a through hole 43 is formed in the silicon substrate 10. In this step, the insulating film 13 on the first main surface is also etched. Subsequently, as shown in FIG. 20, an insulating film 22 is formed in the through hole 43 and on the second main surface. After that, the insulating film 22 on the internal electrode 26 on the bottom of the through hole is removed by anisotropic etching. Then, a conductor layer 23 is formed on the insulating film 22 and on the internal electrode 26 on the bottom of the through hole.

The embodiment of the present invention can provide a semiconductor package having electrode pads that function as a good stopper when forming a through-hole electrode in a semiconductor substrate, and allow a high-quality test to be conducted in a testing step such as die sort test.

Also, the embodiments described above can be practiced not only singly but also in the form of an appropriate combination. In addition, the above-mentioned embodiments include inventions in various stages. Therefore, the inventions in various stages can also be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor package comprising:
    an imaging element formed on a first main surface of a semiconductor substrate;
    an external terminal electrode formed on a second main surface opposite to the first main surface of the semiconductor substrate;
    a through-hole electrode which is formed in a through hole formed in the semiconductor substrate, and electrically connects the imaging element on the first main surface and the external terminal electrode on the second main surface;
    a first electrode pad formed on the through-hole electrode in the first main surface of the semiconductor substrate;
    an interlayer insulating film formed on the first electrode pad and on the first main surface of the semiconductor substrate;
    a second electrode pad formed on the interlayer insulating film;
    a passivation film formed on the second electrode pad and the interlayer insulating film, and having an opening which exposes a portion of the second electrode pad; and
    a contact plug formed between the first electrode pad and the second electrode pad in a region which does not overlap the opening when viewed in a direction perpendicular to a surface of the semiconductor substrate.

2. The package according to claim 1, wherein the contact plug electrically connects the first electrode pad and the second electrode pad.

3. The package according to claim 1, further comprising a third electrode pad formed in the interlayer insulating film between the first electrode pad and the second electrode pad.

4. The package according to claim 1, further comprising:
    a color filter formed opposite to the imaging element; and
    a microlens formed on the color filter to be opposed to the imaging element.

5. The package according to claim 4, further comprising:
    an adhesive formed on the second electrode pad, and having an opening which exposes the microlens; and
    a light-transmitting substrate formed on the adhesive.

6. The package according to claim 1, wherein
    the first electrode pad is a stopper film which prevents etching of the interlayer insulating film when forming the through-hole electrode in the semiconductor substrate, and
    the second electrode pad is an electrode pad to be brought into contact with a needle in a die sort test.

7. A semiconductor package comprising:
    an imaging element formed on a first main surface of a semiconductor substrate;

an external terminal electrode formed on a second main surface opposite to the first main surface of the semiconductor substrate;

a through-hole electrode which is formed in a through hole formed in the semiconductor substrate, and electrically connects the imaging element on the first main surface and the external terminal electrode on the second main surface;

a first electrode pad formed on the through-hole electrode in the first main surface of the semiconductor substrate;

an interlayer insulating film formed on the first electrode pad and on the first main surface of the semiconductor substrate;

a second electrode pad formed on the interlayer insulating film; and a contact plug formed between the second electrode pad and the first electrode pad in a region which does not overlap the through-hole electrode when viewed in a direction perpendicular to a surface of the semiconductor substrate.

8. The package according to claim 7, wherein the contact plug electrically connects the first electrode pad and the second electrode pad.

9. The package according to claim 7, further comprising a third electrode pad formed in the interlayer insulating film between the first electrode pad and the second electrode pad.

10. The package according to claim 7, further comprising:
a color filter formed opposite to the imaging element; and
a microlens formed on the color filter to be opposed to the imaging element.

11. The package according to claim 10, further comprising:
an adhesive formed on the second electrode pad, and having an opening which exposes the microlens; and
a light-transmitting substrate formed on the adhesive.

12. The package according to claim 7, wherein
the first electrode pad is a stopper film which prevents etching of the interlayer insulating film when forming the through-hole electrode in the semiconductor substrate, and
the second electrode pad is an electrode pad to be brought into contact with a needle in a die sort test.

13. A semiconductor package comprising:
an imaging element formed on a first main surface of a semiconductor substrate;
an external terminal electrode formed on a second main surface opposite to the first main surface of the semiconductor substrate;
a through-hole electrode which is formed in a through hole formed in the semiconductor substrate, and electrically connects the imaging element on the first main surface and the external terminal electrode on the second main surface;
a first electrode pad formed on the through-hole electrode in the first main surface of the semiconductor substrate;
an interlayer insulating film formed on the first electrode pad and on the first main surface of the semiconductor substrate;
a second electrode pad formed on the interlayer insulating film;
a passivation film formed on the second electrode pad and the interlayer insulating film, and having an opening which exposes a portion of the second electrode pad; and
a contact plug formed between the first electrode pad and the second electrode pad, the contact plug being positioned immediately below a portion of the second electrode pad, which is overlapped by the passivation film.

14. The package according to claim 13, wherein the contact plug electrically connects the first electrode pad and the second electrode pad.

15. The package according to claim 13, further comprising a third electrode pad formed in the interlayer insulating film between the first electrode pad and the second electrode pad.

16. The package according to claim 13, further comprising:
a color filter formed opposite to the imaging element; and
a microlens formed on the color filter to be opposed to the imaging element.

17. The package according to claim 16, further comprising:
an adhesive formed on the second electrode pad, and having an opening which exposes the microlens; and
a light-transmitting substrate formed on the adhesive.

18. The package according to claim 13, wherein
the first electrode pad is a stopper film which prevents etching of the interlayer insulating film when forming the through-hole electrode in the semiconductor substrate, and
the second electrode pad is an electrode pad to be brought into contact with a needle in a die sort test.

* * * * *